United States Patent [19]

Kudo

[11] Patent Number: 4,641,419
[45] Date of Patent: Feb. 10, 1987

[54] FABRICATING AN INTEGRATED CIRCUIT DEVICE HAVING A VERTICAL PNP TRANSISTOR

[75] Inventor: Satoshi Kudo, Takasaki, Japan

[73] Assignee: Hitachi, Ltd., Tokyo, Japan

[21] Appl. No.: 712,761

[22] Filed: Mar. 18, 1985

[30] Foreign Application Priority Data

Mar. 16, 1984 [JP] Japan ................................ 59-49060

[51] Int. Cl.⁴ .................... H01L 21/74; H01L 21/265
[52] U.S. Cl. ........................................ 29/591; 29/571;
29/576 B; 29/576 E; 29/576 W; 29/578;
29/589; 29/591; 148/1.5; 148/175; 148/DIG.
10; 357/33; 357/34; 357/44; 357/50
[58] Field of Search ................. 29/571, 576 B, 576 E,
29/576 W, 578, 589, 597; 148/1.5, 175; 357/34,
33, 44, 50

[56] References Cited

U.S. PATENT DOCUMENTS

| | | | |
|---|---|---|---|
| 3,930,909 | 1/1976 | Schmitz et al. | 29/576 E X |
| 3,956,035 | 5/1976 | Herrmann | 29/576 E X |
| 4,412,376 | 11/1983 | De Bar et al. | 29/576 W X |
| 4,485,552 | 12/1984 | Magdo et al. | 29/576 W X |
| 4,495,010 | 1/1985 | Kranzer | 148/1.5 |
| 4,550,491 | 11/1985 | Depey | 29/577 C |

Primary Examiner—Upendra Roy
Attorney, Agent, or Firm—Antonelli, Terry & Wands

[57] ABSTRACT

A process for producing semiconductor devices with a high-performance vertical pnp transistor having a high $h_{fe}$ and a high $f_T$, comprising a step for forming an impurity region of a high concentration in a portion of a p-type buried layer and for increasing the concentration in a diffusion layer for isolation, a step for forming an n-type well region that reaches the p-type buried layer and that serves as a base of the vertical pnp transistor, and a step for forming an emitter of the vertical pnp transistor in a portion of said n-type well region, and for forming a collector electrode contact portion of the vertical pnp transistor, said contact portion reaching said impurity region of high concentration, by introducing p-type impurities into a portion of the p-type buried layer that serves as a portion of the collector of the vertical pnp transistor and into the p-type diffusion layer that works as an isolation layer or channel stop layer.

36 Claims, 23 Drawing Figures

PNP TRS     NPN TRS

FABRICATING AN INTEGRATED CIRCUIT DEVICE HAVING A VERTICAL PNP TRANSISTOR

BACKGROUND OF THE INVENTION

The present invention relates to a process for producing semiconductor devices, and particularly to a process for producing semiconductor devices having vertical pnp transistors.

Pnp transistors are essential in current technology and play an important role in bipolar circuits. However, pnp transistors exhibit performance characteristics such as current amplification factor $h_{fe}$ and gain-bandwidth product $f_T$ which are considerably inferior to those of the npn transistor. With the npn transistor, for instance, a gain-bandwidth product $f_T$ of about 100 MHz can be realized. With the pnp transistor, however, the gain-bandwidth product $f_T$ is several MHz at best.

Poor performance of the pnp transistor can be attributed to the following reasons:

(1) The pnp transistor is usually constructed in a lateral configuration in which p-type layers are arranged in the lateral direction while using an epitaxial n-type layer in its own form, as disclosed in "Integrated Circuit Engineering (1)" published by Corona Publishing Co., 1979, pp. 165-168. With this structure, most of the positive holes injected through the emitter are stored in the epitaxial layer, and only a small proportion of positive holes arrive at the collector.

(2) The base width $W_B$, which is an important parameter in determining transistor performance, varies depending upon the processing precision of the photomask and the photoresist and depending upon the diffusion conditions of the emitter and collector. Namely, it is difficult to control the base width $W_B$, or it is difficult to greatly reduce the base width.

(3) Distribution of impurity concentration varies in the epitaxial layer that works as a base.

In view of the above-mentioned respects, the inventors have prepared a pnp transistor of a vertical structure like the npn transistor, in an effort to enhance the performance.

The inventors have further clarified, through study of the subject, that the number of manufacturing steps increases considerably if it is attempted to form an npn transistor and a vertical pnp transistor in the same semiconductor substrate, with a subsequent increase in manufacturing costs.

SUMMARY OF THE INVENTION

The present invention is to solve the above-mentioned problems, and an object of the invention is to provide a novel process for producing semiconductor devices of high performance having vertical pnp transistors, and the product formed thereby.

Another object of the present invention is to provide a novel process for producing semiconductor devices, which makes it possible to form an npn transistor and a vertical transistor (e.g., a pnp transistor) of high performance in the same semiconductor substrate without causing the manufacturing steps to become complex, as well as the product formed thereby.

A representative example of the present invention is described below briefly. However, the present invention is not to be limited thereto.

That is, in forming an n-type silicon layer on the surface of a silicon semiconductor substrate, the n-type silicon layer being divided into a plurality of regions, electrically isolated from each other by an isoplanar oxide film, thereby to form vertical pnp transistors in the n-type silicon layer, the below-mentioned steps are utilized in order to accomplish the aforementioned objects.

(1) In order to form a portion of the collector region of the pnp transistor, a p-type buried layer is formed in the bottom of the n-type silicon layer by utilizing the step of introducing p-type impurities, e.g., into the substrate, which p-type impurities are also to form a channel stopper just under the isoplanar oxide film.

(2) P-type impurities are introduced into portions of the channel stopper region and the p-type buried layer, to increase the impurity concentration in the channel stopper region, and to form a high concentration $p^+$-type region in a portion of the p-type buried layer.

(3) A base width control layer (often called n-well) of the pnp transistor is formed by utilizing the step of forming a collector electrode take-out layer of the npn transistor.

(4) An emitter region and a collector electrode take-out layer of the pnp transistor are formed by utilizing the step of forming a base region of the npn transistor.

(5) A base electrode take-out layer of the pnp transistor is formed by utilizing the step of forming an emitter region of the npn transistor.

As described above, the vertical pnp transistor can be formed without increasing the number of steps for manufacturing high performance npn transistors.

Moreover, the pnp transistor base width can be correctly determined, making it possible to increase the gain-bandwidth product $f_T$ and the current amplification factor $h_{fe}$.

BRIEF DESCRIPTION OF THE DRAWINGS

FIGS. 1 to 9 illustrate the steps for producing semiconductor devices according to one embodiment of the present invention, wherein

FIGS. 11 and 12 are plan views for comparing the pattern of an existing lateral pnp transistor with the pattern of a vertical pnp transistor of the present invention, wherein

DETAILED DESCRIPTION OF THE INVENTION

Embodiment 1

FIGS. 1 to 9 illustrate an embodiment of the present invention wherein semiconductor regions are isolated by an isoplanar oxide film, and a vertical pnp transistor and an npn transistor are formed in such regions, and are section views of steps in a process for producing semiconductor devices. These steps will be described below in detail.

Figure 1:
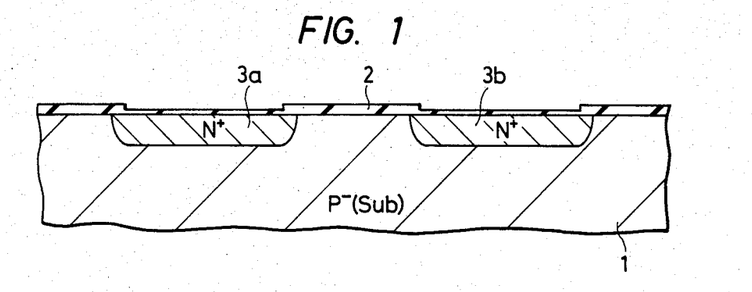
FIG. 1 is a section view of a step for forming $n^+$-type buried layers using a single crystalline $p^-$-type silicon substrate.

(1) As shown in FIG. 1, a p$^-$-type silicon substrate 1 having a resistivity which is as high as, for example, 8 to 13 ohms.cm is prepared. This substrate is heat-treated at 1000° C. for 120 minutes in a wet atmosphere, so that a thermally oxidized film which is, for example, 5000 angstroms thick is formed on one main surface of the silicon substrate. The oxide film is then partially removed by the customarily employed, known technique of photolithography. Using the oxide film (SiO$_2$) 2 as a mask, a donor impurity such as antimony is deposited and is diffused at about 1200° C. for 200 minutes to form n$^+$-type buried layers 3a, 3b which have a diffusion depth of 2 to 3 μm and a resistance of about 45 ohms, for example.

Figure 2:
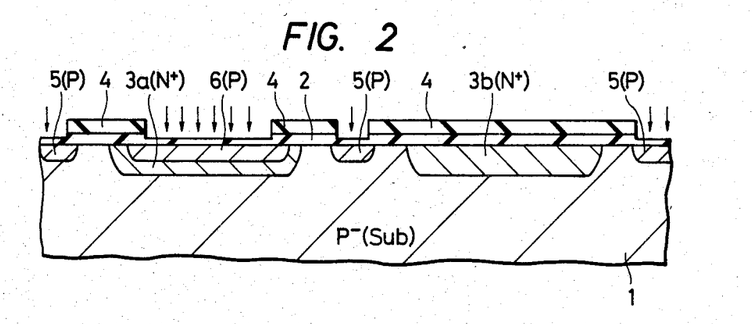
FIG. 2 is a section view of a step for forming a channel stopper, and a collector region (p-type buried layer) of the pnp transistor.

(2) As shown in FIG. 2, a photoresist mask 4 is locally formed, and boron, which is an acceptor impurity, is introduced via the photoresist film 4 into the substrate by the ion implantation method. The energy for ion implantation is, for example, 80 KeV and the dosage is 2×10$^{14}$ atoms/cm$^2$. Then heat-treatment is effected at about 1200° C. for 60 minutes to form a p-type diffusion layer 5 in a portion that serves as a channel stopper, and a p-type buried layer 6 is formed in a portion of the surface of the n$^+$-type buried layer 3a.

Figure 3:
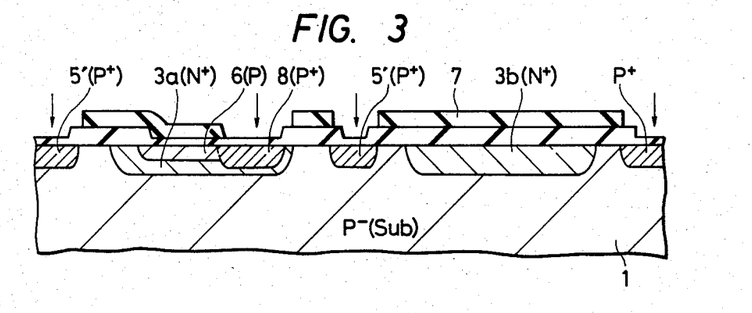
FIG. 3 is a section view of a step for forming a $p^+$-type channel stopper of a high concentration, and a $p^+$-type buried layer of a high concentration, by implanting impurity ions into the channel stopper region and into a portion of the collector region of the pnp transistor.

(3) As shown in FIG. 3, boron ions are implanted via a photoresist mask 7 that is locally formed on the semiconductor substrate, in order to form p$^+$-type buried layers 8 and 5' of a high concentration in a portion of the p-type buried layer 6 and in the p-type layer 5 in the channel stopper portion. The energy of ion implantation is, for example, 50 KeV, and the dosage is 5×10$^{13}$ atoms/cm$^2$. Ion implantation is effected twice. If ions are introduced in large amounts at one time, the silicon crystal is seriously damaged, giving rise to crystalline flaws. Thus, there are formed diffusion layer 5' having a p-type impurity concentration which is high enough to serve as channel stoppers, and a p$^+$-type collector layer 8 having a sufficiently small collector series resistance $r_{cs}$. Thereafter, the oxide film 2 and the photoresist mask 7 are removed from the surface.

Figure 4:
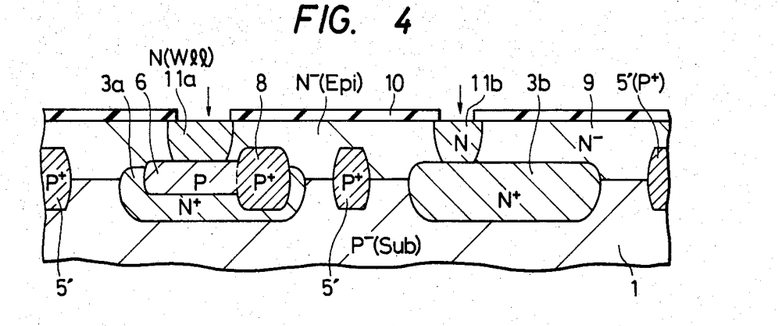
FIG. 4 is a section view of a step for forming an n-type well region in a portion of the npn transistor-forming region and in a portion of the pnp transistor-forming region, after an $n^-$-type silicon layer has been epitaxially grown on the single crystalline $p^-$-type silicon substrate.

(4) A silicon layer doped with phosphorus at a low concentration is epitaxially grown on the whole surface, for example, at 970° C. for 15 minutes to form an n$^-$-type silicon layer 9 which is, for example, 1 to 2 μm thick and which has a resistivity of 1.6 ohms.cm. As shown in FIG. 4, the n$^+$-type buried layer and p$^+$-type buried layer are upwardly diffused to some extent due to the heat treatment of epitaxial growth. Then, using a surface oxide film 10 on the n$^-$-type silicon layer or a photoresist film as a mask, phosphorus ions are implanted into the n$^-$-type silicon layer 9 under the conditions of, e.g., an implantation energy of 150 KeV and a dosage of 1×10$^{14}$ atoms/cm$^2$ and are diffused at 1200° C. for 200 minutes to form n-type well regions 11a, 11b that reach the buried layers.

Figure 5:
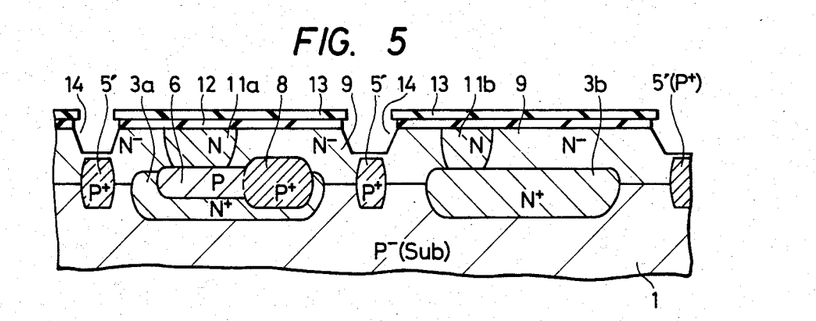
FIG. 5 is a section view of a step for forming grooves in the isolation regions.

(5) As shown in FIG. 5, an oxide film (SiO$_2$) 12 and a nitride film (Si$_3$N$_4$) 13, newly formed on the surface by conventionally known techniques, are partially etched, and using these films as masks, the silicon layer 9 is anisotropically etched to form grooves 14 at positions over the channel stopper p-type layers 5'. The plane (100) is selected as a crystalline surface of the substrate that is to be subjected to anisotropic etching, and use is made of an alkaline etching solution consisting of hydrazine and hydrofluoric/nitric acid, to obtain the grooves 14 having steep side surfaces and a depth of about 0.9 μm, for example.

Figure 6:
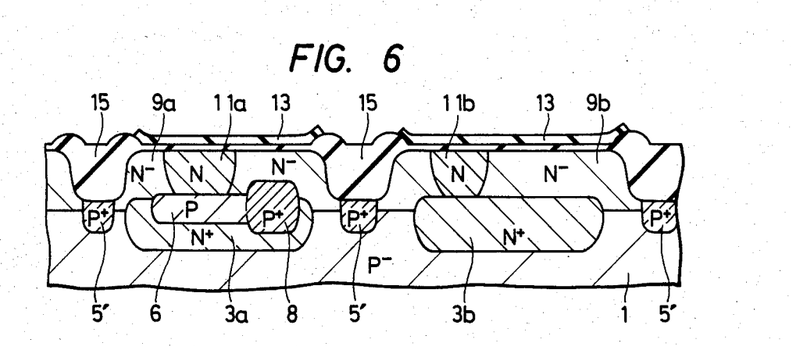
FIG. 6 is a section view showing a state where the substrate is oxidized with an antioxidation film as a mask.

(6) Using the nitride film 13 as an antioxidation mask, silicon is selectively oxidized in a steam atmosphere under the conditions of 5 atms., 1000° C., for 145 minutes, to form isolation oxide films 15 in the grooves as shown in FIG. 6. The regions 9a and 9b are electrically isolated from each other by the isolation oxide film 15 and the p-type layer 5. The region 9a forms a pnp transistor, and the region 9b forms an npn transistor.

Figure 7:
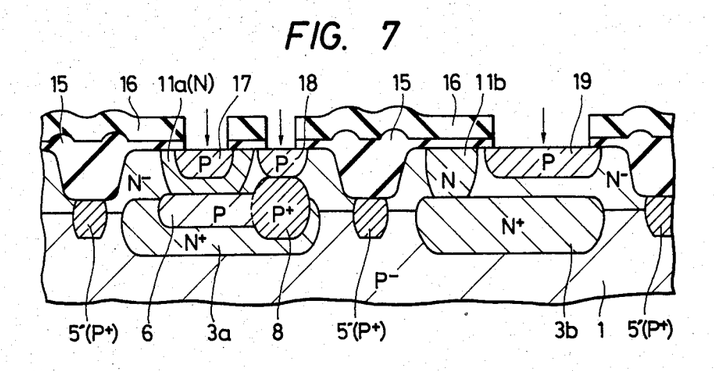
FIG. 7 is a section view showing a state where a base region is formed in the npn transistor-forming region, and an emitter region and a collector take-out layer are formed in the pnp transistor-forming region, the collector take-out layer being in contact with the p-type buried layer.

(7) The nitride film is removed. Then, using a photoresist mask 16 formed on the surface, portions of the oxide film 12 are opened as shown in FIG. 7, and boron ions are implanted under the conditions of an implantation energy of, e.g., 50 KeV and a dosage of 2.2×10$^{14}$ atoms/cm$^2$. Then, heat-treatment is effected in an nitrogen atmosphere at 1000° C. for about 90 minutes to diffuse the introduced impurities, thereby to form a p-type layer 17 and a p-type layer 18 in a portion of the surface of the region 9a and to form a p-type layer 19 in a portion of the surface of the region 9b. The p-type layer 17 serves as an emitter of the pnp transistor, the n-type well region 11a serves as a base, the p-type buried layers 6, 8 serve as collectors, and the p-type layer 18 serves as a collector take-out portion.

Figure 8:
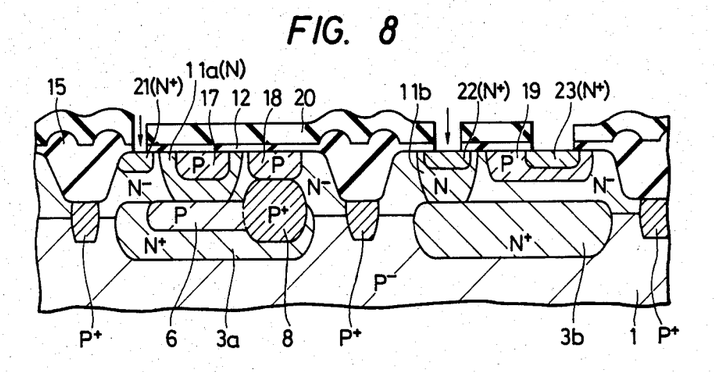
FIG. 8 is a section view showing a state where an emitter region and a collector take-out layer are formed in the npn transistor-forming region, and a base take-out layer is formed in the pnp transistor-forming region.

(8) Using a photoresist mask 20 which is newly formed, other portions of the oxide film 12 are opened as shown in FIG. 8, and arsenic ions are implanted under the conditions of, e.g., an implantation energy of 80 KeV and a dosage of 5×10$^{15}$ atoms/cm$^2$, and are then diffused by a heat-treatment effected at 1000° C. for 60 minutes, in order to form an n$^+$-type layer 21 that serves as a base take-out portion in a portion of the surface of the region 9a and to form an n$^+$-type layer 22 and an n+-type layer 23 in portions of the surface of the region 9b. The n+-type layer 22 on the surface of the n-type well region 11b serves as a collector take-out portion of the npn transistor, the p-type layer 19 serves as a base, and the n+-type layer 23 on the surface of the p-type layer 19 serves as an emitter.

(9) The surface of the oxide film 12 is covered with an insulating film 24 such as PSG (phosphosilicate glass) having a phosphorus concentration of 1 to 2 mol and a thickness of 3000 angstroms), followed by contact photoetching. Then, aluminum is deposited thereon by vaporization or sputtering, and patterning of aluminum is effected by etching. Thereafter, heat-treatment is effected at 470° C. for about 10 minutes to form an aluminum electrode 25 that comes into ohmic contact with each of the regions as shown in FIG. 9, wherein symbols $B_1$, $E_1$ and $C_1$ denote the base, emitter and collector of the pnp transistor, and symbols $C_2$, $B_2$ and $E_2$ denote the collector, base and emitter of the npn transistor.

Figure 9:
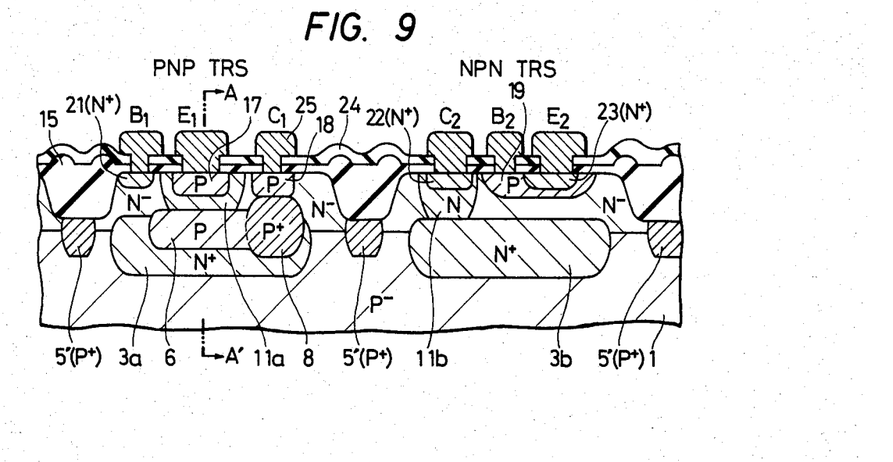
FIG. 9 is a section view showing a state where electrodes are formed for the npn transistor and for the pnp transistor.
Figure 10:
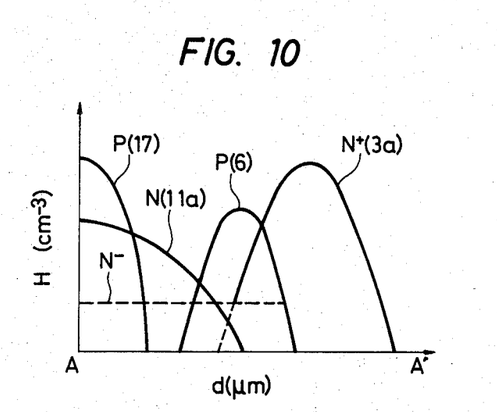
FIG. 10 is a graph showing the distribution of impurity concentrations along the line A—A' of FIG. 9.

FIG. 10 shows profiles of impurity concentration in cross section along the line A—A′ of FIG. 9, i.e., along the vertical section of the vertical pnp transistor.

Figure 11:
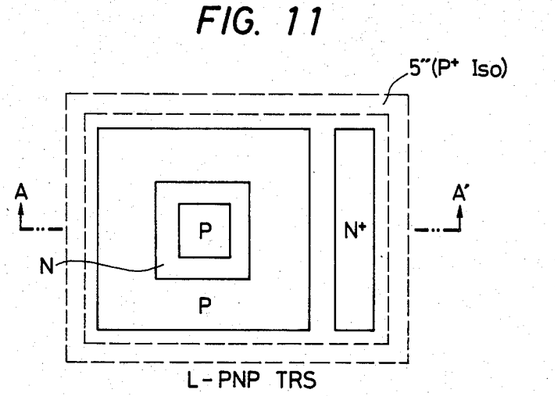
Figure 11A:
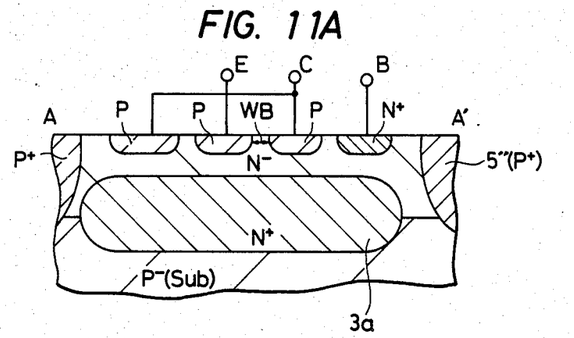
FIGS. 11A and 12A are section views along the line A—A' of FIGS. 11, 12, respectively.
Figure 12:
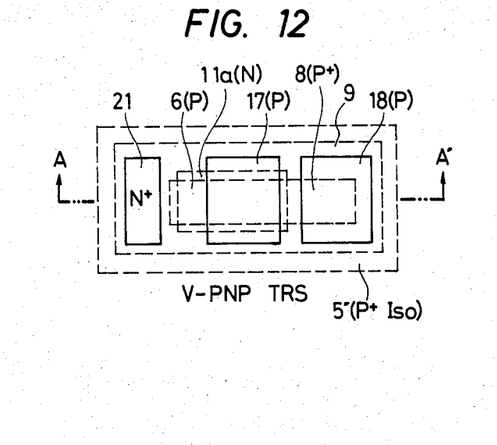
Figure 12A:
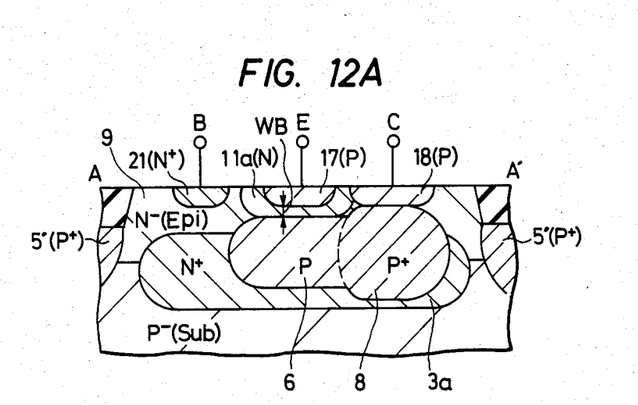

FIG. 11 is a plan view of a pattern of the lateral pnp transistor, and FIG. 11A is a section view along the line A—A′ of FIG. 11. FIG. 12 is a plan view of a pattern of the vertical pnp transistor, and FIG. 12A is a section view along the line A—A′ of FIG. 12. As seen in these drawings, particularly in the section views, in the case of the lateral transistor the carriers are injected through narrow portions of the side junctions of the p-type diffusion layers. In the case of the vertical transistor, on the other hand, the carriers are effectively injected over wide areas of plane junctions of the p-type diffusion layers, and the collector current can be sufficiently increased. This means that the time for charge and discharge can be reduced to realize a gain-bandwidth product $f_T$ which is as high as about 100 MHz.

Below are described the effects obtained from particularly important steps in the aforementioned production process.

In the aforementioned process, steps (3) and (4) are quite important. That is, in the step (3), the p+-type buried layer 8 of a high concentration is formed in a portion of the p-type buried layer 6. The isolation diffusion layers 5′ of a high concentration are also formed. As shown in FIG. 4, these buried layers of high concentration are upwardly diffused accompanying the formation of the epitaxial layer.

As described above, the buried high concentration layer 8 serves as a portion of the collector of the vertical pnp transistor. Owing to the upward diffusion, therefore, the contact region 18 (FIG. 7) of collector electrode can be formed by effecting the diffusion by heat only to a slight degree. Further, presence of the buried high concentration layer 8 helps reduce the collector series resistance $r_{cs}$ of the vertical pnp transistor.

Here, if the p-type buried layer has a high concentration to which the n-type well region 11a is connected, the p-type impurities diffuse from the p-type buried layer into the n-type well region 11a, and the effective base width $W_B$ of the vertical pnp transistor changes. In order to prevent such a change, therefore, the buried high concentration layer 8 is formed in a portion of the p-type buried layer 6.

The isolation diffusion layer 5′ has an impurity concentration which is so high as to maintain a sufficiently large reverse withstand voltage and to prevent the occurrence of parasitic channels. Furthermore, as mentioned above, the isolation diffusion layer 5′ is formed accompanying the formation of the epitaxially grown layer. When a groove for forming the isolation region is engraved in the epitaxial layer, therefore, the depth of the groove need only be small, enabling the time required for this step to be reduced (see FIGS. 5 and 6). As can be appreciated, the groove can be extended to reach layer 5′.

Attention should further be given to the fact that by inserting the n-type well region 11a in which the impurity concentration is precisely controlled, the base width $W_B$ of the vertical pnp transistor can be correctly determined. That is, in FIG. 11, the base width $W_B$ is greatly affected by the mask-alignment precision and by the precision of photoresist processing, causing the transistor performance to vary greatly. Referring to FIG. 12, on the other hand, the base width which is a distance between the p-type buried layer 6 and the p-type emitter layer 17 can be precisely determined by the n-type well region 11a. For instance, even when the p-type buried layer 6 is unnecessarily diffused, the n-type well region 11a offsets the unnecessary portions, leaving necessary base width $W_B$ only. Since the base width $W_B$ can be maintained small and constant, the current amplification factor $h_{fe}$ can be increased and maintained constant. Further, the base width $W_B$ is determined by determining the impurity concentration in the n-type well region 11a; i.e., a base width $W_B$ of any size can be formed. That is, since the base width $W_B$ is reduced, the cut-off frequency $f_T$ can be increased. Further, the n-type well region 11a prevents contact between the p-type collector takeout layer 18 and the p-type emitter layer 17. This makes it possible to form a vertical pnp transistor maintaining good reproduceability, uniform characteristics and high performance. Further, the n-type well region has a gradient of concentration and exhibits a drift function.

Further, if the size of the lateral pnp transistor shown in FIG. 11 is compared with the size of the vertical pnp transistor shown in FIG. 12, calculation by the inventors indicates that the size of the vertical pnp transistor is as small as about 0.42 times the size of the lateral pnp transistor.

From the practical point of view, furthermore, the vertical transistor of the present invention exhibits a large current amplification factor $h_{fe}$ and gives advantages.

Figure 20:
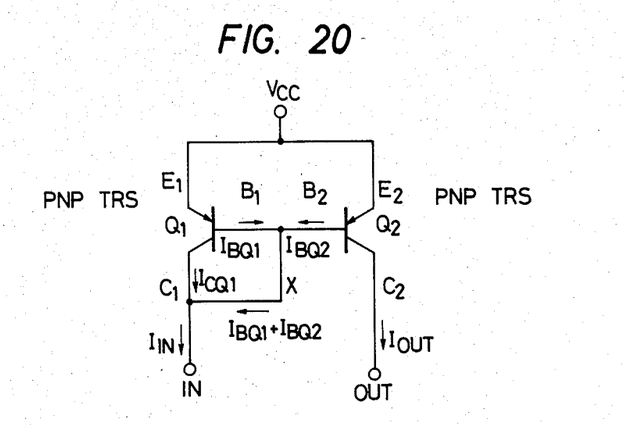
FIG. 20 is a diagram of a current mirror circuit using pnp transistors.
Figure 21:
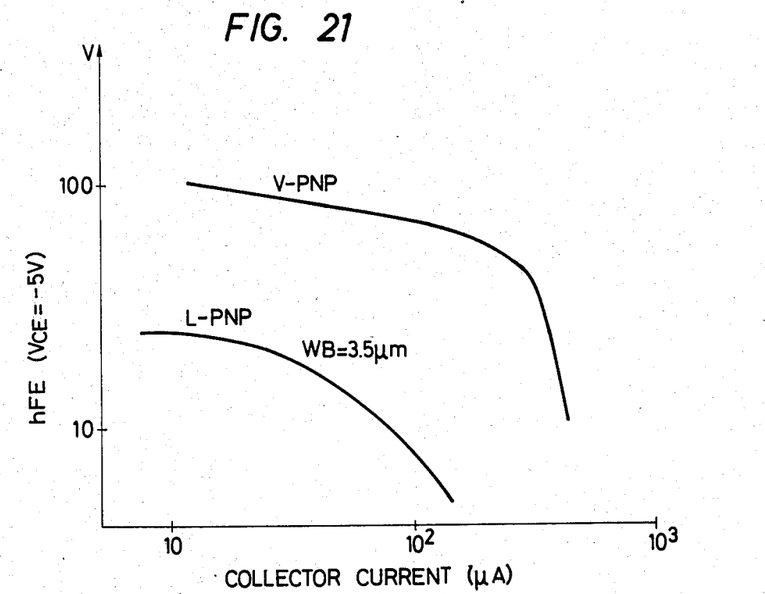
FIG. 21 is a diagram of $h_{fe}$-collector current curves of a lateral pnp transistor and a vertical pnp transistor.

FIG. 21 shows a relationship between the collector current and $h_{fe}$ of the vertical pnp transistor of the present invention and the lateral pnp transistor. It will be comprehended from FIG. 21 that the vertical pnp transistor of the present invention exhibits very high performance. An example will be described below with reference to a constant-current circuit (current mirror circuit) which is shown in FIG. 20.

Emitter terminals $E_1$, $E_2$ of the two pnp transistors $Q_1$, $Q_2$ are connected to a power source voltage $V_{CC}$. Base terminals $B_1$, $B_2$ are connected together and are further connected via wiring X to the collector terminal of the transistor $Q_1$. If these transistors have a current amplification factor $h_{fe}$, then $I_{BQ1}=I_{BQ2}=I_B$, and $I_C=I_B\times h_{fe}$. Therefore, $I_{in}=I_{CQ1}+2I_{BQ1}$, and $I_{out}=I_{BQ2}\times h_{fe}$.

A current mirror ratio C is given by, $$C=(I_{in}/I_{out})=(I_B\times h_{fe}+2I_B)/(I_B\times h_{fe}) \qquad (1)$$

The current mirror ratio C should ideally be 1. As will be obvious from the equation (1), the current mirror ratio varies depending upon the current amplification factor $h_{fe}$. For convenience, the case described below is when the current amplification factor $h_{fe}$ is as small as 10. In this case, the current mirror ratio C is C=1.2. However, when the current amplification factor $h_{fe}$ is as great as 100, as with the vertical pnp transistor of the present invention, the current mirror ratio C becomes C=1.02, which is close to the ideal value.

We may conclude from this that if the vertical pnp transistors of the present invention are used for a constant-current circuit, it is possible to obtain an excellent current mirror ratio.

Effects

According to the above-described embodiment 1 of the present invention, the following effects are obtained.

(1) By utilizing the step of diffusing p-type impurities to form a channel stopper that constitutes an isolation layer in the isoplanar technique, it is possible to form the p-type buried layer 6 that serves as a collector of the vertical pnp transistor without the need of newly adding a diffusion step.

(2) The collector electrode take-out layer 11b of the npn transistor and the n-type well region 11a that serves as a base of the pnp transistor are formed in the same step. Further, the p-type layer 17 that serves as an emitter of the pnp transistor, and the p-type layer 18 that serves as a collector take-out portion, are formed by utilizing the step of diffusing p-type impurities for forming a base of the npn transistor. Moreover, the base electrode take-out layer of the pnp transistor is formed by utilizing the step of forming the emitter of the npn transistor. By commonly utilizing the steps as mentioned above, the process is prevented from becoming complex.

(3) Since the pnp transistor is of the vertical type, the collector current can be increased compared with that of the lateral pnp transistor of the same size.

(4) To obtain a sufficiently large drive current, the lateral pnp transistors must be connected in parallel. The vertical pnp transistor, however, can be used alone to obtain a sufficiently large drive current, since it has a good current amplification factor $h_{fe}$ as shown in FIG. 21.

(5) The vertical pnp transistor cell size can be smaller than the lateral pnp transistor. For instance, the area can be halved. This fact will be obvious from a comparison of the plan view of FIG. 11, showing a pattern of the lateral pnp transistor, with the plan view of FIG. 12, showing a pattern of the vertical pnp transistor.

(6) By forming the n-type well layer, the impurity concentration can be correctly controlled in the base of the pnp transistor. Further, the p-type buried layer 6 that serves as a collector, the collector take-out portion 18, and the p+-type buried layer 8 connecting thereto, can be prevented from contacting the p-type layer that serves as the emitter.

(7) Owing to the effect mentioned in (6) above, the base width WB of the vertical pnp transistor can be controlled precisely, to form a high performance transistor that is relatively easy to produce.

(8) The circuit can be easily constructed with vertical pnp transistors. The current mirror circuit which uses the pnp transistors in a complementary manner is much dependent upon the current amplification factor $h_{fe}$.

Therefore, the current mirror ratio decreases when the current amplification factor $h_{fe}$ is small. However, the vertical pnp transistor of the present invention, having a high current amplification factor $h_{fe}$, makes it possible to obtain a sufficiently large current mirror ratio.

(9) The operation region of the vertical pnp transistor resides in the substrate, and is not affected by interface ions. Therefore, the noise factor NF can be improved.

Embodiment 2

Figure 13:
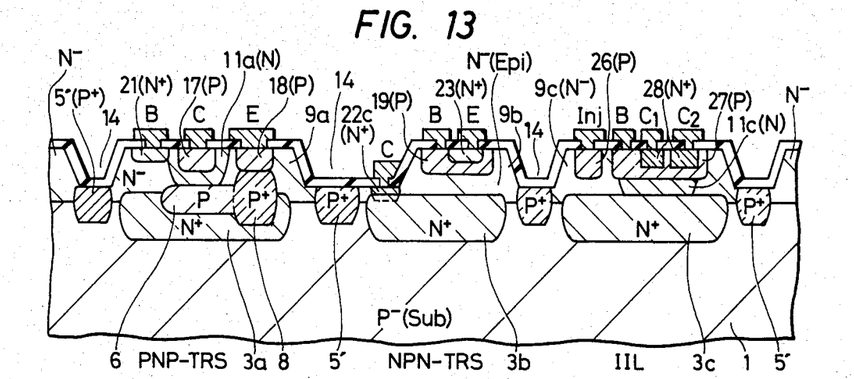
FIG. 13 is a vertical section view of a finished semiconductor device according to another embodiment of the present invention.

FIG. 13 illustrates an embodiment of the present invention in which semiconductor regions are formed and isolated from each other by grooves thereby to form semiconductor regions in which a vertical pnp transistor, a vertical npn transistor, and an IIL (injection integrated logic) are formed. FIG. 13 is a section view of a finished semiconductor device. Isolation of the elements by grooves is called HIT (high density isolation technology), a technique that was developed by the applicant of the present invention. Thus, in such HIT, deep grooves, formed by wet etching utilizing hydrofluoric acid, are provided.

The process conditions are nearly the same as those of the aforementioned embodiment and are not described here.

In FIG. 13, reference numeral 1 denotes a common p⁻-type silicon substrate, reference numerals 3a, 3b and 3c denote n+-type buried layers, 6 denotes a p-type buried layer, and 8 denotes a p+-type buried layer. These buried layers 6 and 8 are formed in the step of forming a p+-type isolation (channel stopper) layer 5'.

Reference numeral 14 denotes grooves for isolation that can be formed in the same manner as the formation of grooves in the isoplanar process. In this embodiment 2, the groove 14 is formed widely to stretch to a portion where a collector take-out portion (n+-type layer 22c) of the npn transistor is formed, so that n+-type impurities need not be deeply diffused to form the collector take-out portion. Thus, as can be seen in FIG. 13, such groove 14 extends on p+-type isolation layer 5' and the collector take-out portion for the npn transistor. A p-type emitter layer 17 and a p-type collector take-out layer 18 constituting the vertical pnp transistor are formed simultaneously with the formation of a p-type diffusion layer 19 that serves as a base of the vertical npn transistor. An n+-type layer 21 that serves as a base take-out portion of the pnp transistor is formed simultaneously with the formation of an n+-type diffusion layer 23 that serves as an emitter of the npn transistor and a collector take-out portion 22.

In the IIL portion, a p-type injector layer 26 and a p-type base layer 27 of the inverse npn transistor are formed simultaneously with the formation of a p-type diffusion layer 19 that serves as a base of the npn transistor. A multicollector 28 of the inverse npn transistor is formed simultaneously with the formation of the n+-type diffusion layer 23 that serves as the emitter of the npn transistor.

As an example, in this embodiment shown in FIG. 13 the depth of the epitaxial layers 9a, 9b and 9c are 1–2 microns, and the depth of the grooves 14 is, e.g., 0.8 micron.

The semiconductor device of the Embodiment 2 exhibits the same effects as those mentioned in the Embodiment 1. Moreover, such device of Embodiment 2 provides the following additional effects.

(1) Since the depth of the P+-layers (the diffusion layers) of FIG. 13 is shallow, the area of isolation can be extremely reduced.

(2) Since the depth of N+-collector take-out portion (layer 22c) is shallow, the collector series resistance is reduced.

With the isolation structure using grooves, furthermore, the present invention can also be effectively applied even where the IIL is made present.

Embodiment 3

FIGS. 14 to 19 are section views illustrating major steps in a process for producing semiconductor devices according to an embodiment of the present invention wherein a vertical pnp transistor that is partly constituted by a Schottky barrier electrode, and an npn transistor, are formed in one semiconductor substrate.

Figure 14:
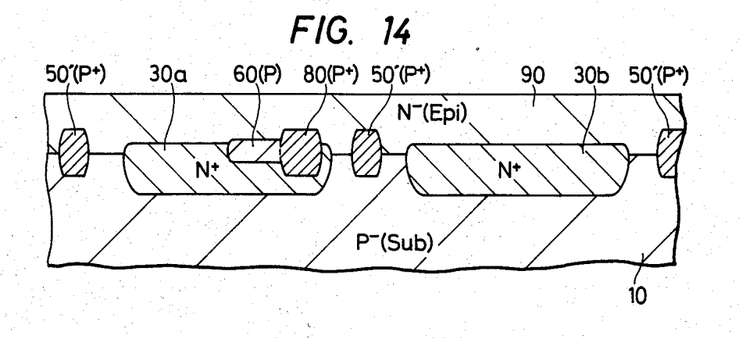
FIGS. 14 to 19 are section views illustrating major steps in a process for producing semiconductor devices according to a further embodiment of the present invention.

(1) FIG. 14 illustrates the state where n+-type buried layers 30a, 30b, p-type buried layers 60, 80, p+-type isolation layer 50' and epitaxial n--type silicon layer 90 are formed on a p--type silicon substrate 10 having a resistivity of 8 to 13 ohms.cm (see (1) to (4) of embodiment 1).

Figure 15:
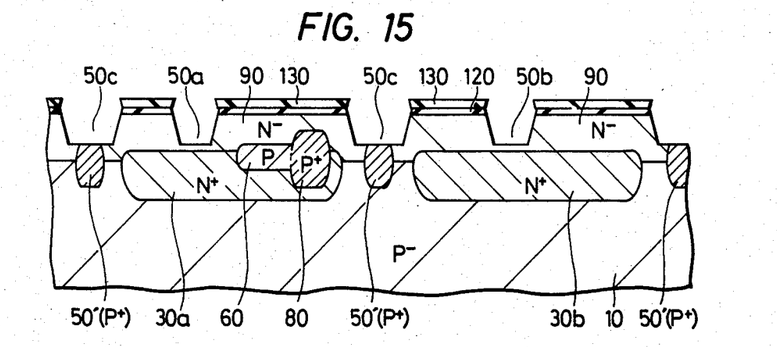

(2) With an oxide film 120 and a nitride film 130 as masks, grooves 50 are formed to a depth of 0.9 μm as shown in FIG. 15 using hydrazine and hydrofluoric/nitric acid. Among these grooves 50, a groove 50a works to isolate the base of the pnp transistor, a groove 50b works to isolate the collector of the npn transistor, and a groove 50c works to isolate the element.

Figure 16:
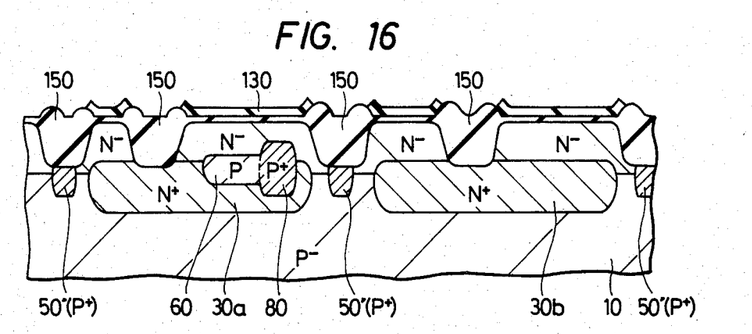

(3) Using the nitride film 130 as a mask, the oxidation is effected selectively in a steam atmosphere under the conditions of a pressure of 5 atms., at a temperature of 1000° C., for 145 minutes, in order to form an isolation oxide film 150 in the grooves as shown in FIG. 16, thereby to isolate a region 90a for forming the pnp transistor and a region 90b for forming the npn transistor.

Figure 17:
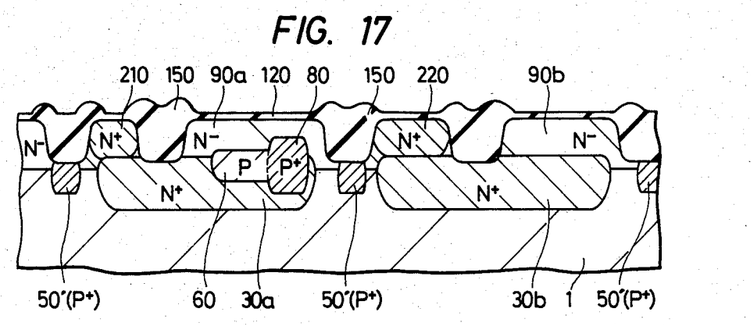

(4) The nitride film 130 is removed, portions of the oxide film 120 are opened to introduce phosphorus ions by the ion implantation method under the conditions of, e.g., an implantation energy of 80 KeV, and a dosage of $1 \times 10^{20}$ atoms/cm$^2$, followed by diffusion at 1000° C. for 120 minutes, thereby to form, as shown in FIG. 17, an n+-type base takeout layer 210 of the pnp transistor and an n+-type collector take-out layer 220 of the npn transistor. These layers are connected to the n--type base region 90a and to the n--type collector region 90b via the n+-type buried layers 30a, 30b.

Figure 18:
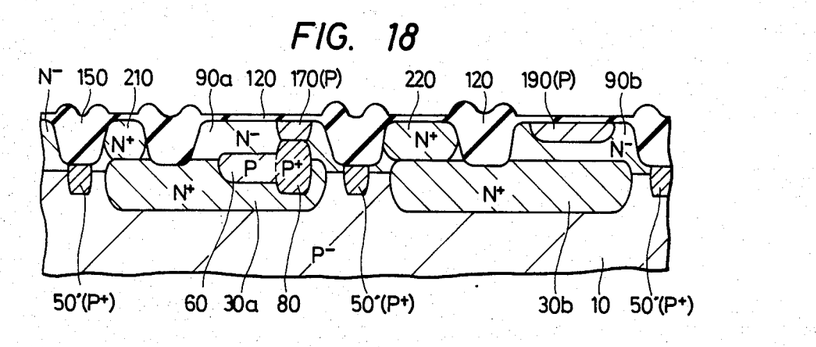

(5) Portions of the oxide film 120 are opened, and boron ions are implanted under the conditions of, e.g., an implantation energy of 50 KeV and a dosage of $2.2 \times 10^{14}$ atoms/cm$^2$, and are diffused by heat-treatment in an nitrogen atmosphere at a temperature of 1000° C. for 90 minutes, thereby to form, as shown in FIG. 18, a p-type emitter layer 170 of the pnp transistor so as to be connected to the p+-type buried layer 80 and, at the same time, to form a p-type base layer 190 of the npn transistor.

Figure 19:
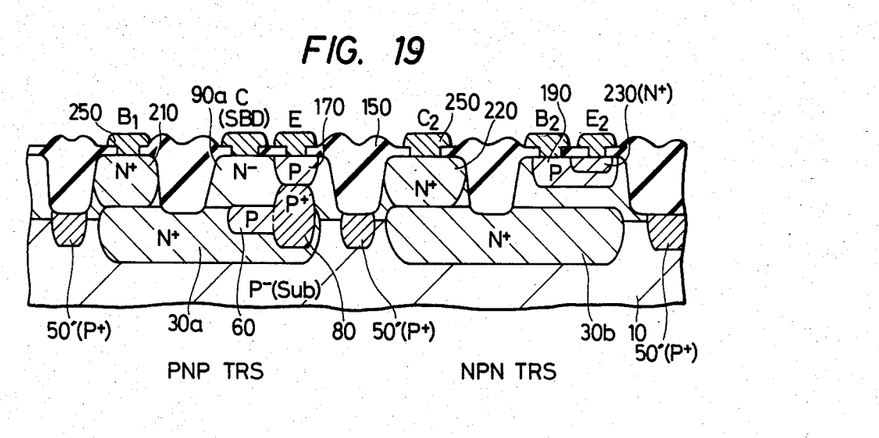

(6) As shown in FIG. 19, arsenic ions are implanted into a portion of the surface of the p-type base layer 190 of the npn transistor under the conditions of, e.g., an implantation energy of 80 KeV and a dosage of $5 \times 10^{15}$ atoms/cm$^2$, followed by diffusion effected at 1000° C. for 60 minutes, thereby to form an n+-type emitter layer 230. Simultaneously with the diffusion for forming the emitter, the n+-type impurities may be diffused to lower the surface resistance of the n+-type base take-out layer 210 of the pnp transistor and of the n+-type collector take-out layer 220 of the npn transistor.

Finally, the contacts are formed. Initially, aluminum is deposited by sputtering. Patterning is then effected by etching to form aluminum electrodes 250. Then, directly on the surface of the n--type silicon layer 90a of the pnp transistor, aluminum is heat-treated at 470° C. for about 10 minutes, thereby to establish ohmic contact between aluminum and silicon, and Schottky barrier contact. The electrode contacting the n+-type layer 210 serves as a base electrode B$_1$, and the electrode contacting to the p-type emitter layer 170 serves as an emitter electrode, whereby the pnp transistor is completed with a Schottky barrier diode (SBD) as a collector portion.

Effects (1) Because of the vertical structure, components in the vertical direction can be utilized as a collector current, and the operation time constant $\tau_F$ can be reduced for the same base-emitter voltage $V_{BE}$ to increase the cut-off frequency $f_T$.

(2) Since the collector semiconductor region has been replaced by a Schottky barrier metal, injection of minority carriers can be substantially neglected from the Schottky barrier metal to the base region, and the switching speed does not decrease.

(3) The area of the element can be reduced compared with that of an ordinary lateral pnp transistor.

(4) Owing to the effects mentioned in (1) to (3) above, great effects can be obtained if the pnp transistors and npn transistors are used for complementary circuits and particularly for high-frequency circuits.

Although the invention accomplished by the inventors was concretely described above by way of embodiments, it should be noted that the present invention is in no way limited to the aforementioned embodiments only, but can be modified in a variety of other ways without departing from the spirit and scope of the invention. For example, the present invention can be adapted to general linear integrated circuits and digital integrated circuits.

Thus, it is understood that the present invention is not limited to the disclosed embodiments, but is susceptible of numerous changes and modifications as known to those skilled in the art and I, therefore, do not wish to be limited to the details shown and described herein, but intend to cover all such changes and modifications as are encompassed by the scope of the appended claims.

What is claimed is:

1. A process for producing semiconductor devices comprising the steps of:
(1) selectively introducing impurities of a first type of conductivity into one main surface of a semiconductor substrate to form first and second semiconductor regions that are spaced from each other;
(2) selectively introducing impurities of the first type of conductivity into said first semiconductor region and into a portion of said second semiconductor region to increase the impurity concentration in said first semiconductor region and to form a third semiconductor region having an impurity concentration higher than that of said second semiconductor region in a portion of said second semiconductor region;
(3) after the step (2), depositing a semiconductor layer on said one main surface of said semiconductor substrate, said semiconductor layer having a main surface opposite the surface adjacent the substrate;

(4) selectively introducing impurities of the second type of conductivity opposite to said first type of conductivity into said semiconductor layer to form a fourth semiconductor region that extends to said second semiconductor region of the lower impurity concentration from the main surface of said semiconductor layer; and (5) introducing impurities of the first type of conductivity into a portion of said fourth semiconductor region and into said semiconductor layer that corresponds to said third semiconductor region to form a fifth semiconductor region in said fourth semiconductor region and to form a sixth semiconductor region in said semiconductor layer, said sixth semiconductor region reaching said third semiconductor region.

2. A process for producing semiconductor devices according to claim 1, further comprising:

(6) forming grooves in said semiconductor layer which correspond to said first semiconductor region.

3. A process for producing semiconductor devices according to claim 1, further comprising:

(6) forming an electrically insulating film in said semiconductor layer that corresponds to said first semiconductor region, said electrically insulating film reaching said first semiconductor region.

4. A process for producing semiconductor devices according to claim 1, wherein the semiconductor substrate consists of silicon.

5. A process for producing semiconductor devices according to claim 1, wherein the impurity concentration in said first semiconductor region is increased a sufficient amount in step (2) to prevent occurrence of parasitic channels.

6. A process for producing semiconductor devices according to claim 1, wherein the first type of conductivity is p-type conductivity, and the second type of conductivity is n-type conductivity.

7. A process for producing semiconductor devices according to claim 1, wherein said fourth semiconductor region is formed to be spaced from the third semiconductor region.

8. A process for producing semiconductor devices according to claim 1, wherein the first semiconductor region and the second semiconductor region are formed simultaneously.

9. A process for producing semiconductor devices according to claim 1, wherein the third semiconductor region and increased impurity concentration in the first semiconductor region are formed simultaneously.

10. A process for producing semiconductor devices according to claim 1, wherein, during the step (3), the first semiconductor region and the third semiconductor region are extended into the semiconductor layer deposited on said one main surface of the semiconductor substrate.

11. A process for producing semiconductor devices according to claim 2, wherein said grooves are formed above said first semiconductor region, to extend from said main surface of the semiconductor layer toward said first semiconductor region.

12. A process for producing semiconductor devices according to claim 3, wherein said electrically insulating film is formed above said first semiconductor region, to extend from said main surface of the semiconductor layer toward said first semiconductor region.

13. A process for producing semiconductor devices according to claim 3, wherein the electrically insulating film consists of a silicon oxide film.

14. A process for producing semiconductor devices according to claim 6, wherein said semiconductor substrate is of p-type conductivity; wherein, prior to step (1), an $n^+$-type region is formed in said substrate; and wherein in step (1) said second semiconductor region is formed in said $n^+$-type region.

15. A process for producing semiconductor devices according to claim 7, wherein said sixth semiconductor region is formed to be spaced from the fourth semiconductor region.

16. A process for producing semiconductor devices comprising the steps of:

(1) selectively introducing impurities of a second type of conductivity into one main surface of a semiconductor substrate having a first type of conductivity opposite to said second type of conductivity to form first and second layers, having said second type of conductivity, that are spaced from each other;

(2) introducing impurities of the first type of conductivity into a portion of said first layer and into a portion of said semiconductor substrate to form a third layer of the first type of conductivity in the first layer, said third layer adapted to serve as a portion of a collector of a vertical pnp transistor, and to form a fourth layer of the first type of conductivity in a portion of the semiconductor substrate, the fourth layer working as an isolation layer or a channel stop layer;

(3) selectively introducing impurities of the first type of conductivity into a portion of said third layer and into said fourth layer to increase the impurity concentration in said fourth layer and to selectively form a fifth layer in said third layer, said fifth layer having an impurity concentration higher than that of said third layer;

(4) after the step (3), depositing a semiconductor layer of the second type of conductivity on the one main surface of said semiconductor substrate, whereby said first through fifth layers become first through fifth buried layers, said semiconductor layer having a main surface opposite to that adjacent the one main surface of the substrate;

(5) selectively introducing impurities of the second type of conductivity into portions of said semiconductor layer to form a first semiconductor region of the second type of conductivity that extends from the main surface of said semiconductor layer to said third buried layer and that serves as a portion of a base of the vertical pnp transistor, and to form a second semiconductor region of the second type of conductivity that extends from the main surfaces of said semiconductor layer to said second buried layer and that serves as a portion of a collector of an npn transistor, in the semiconductor layer, which is spaced from said first semiconductor region;

(6) selectively introducing impurities of the first type of conductivity into said first semiconductor region and into portions of said semiconductor layer to form a third semiconductor region of the first type of conductivity in the first semiconductor region, the third semiconductor region serving as an emitter of the vertical pnp transistor, to form a fourth semiconductor region of the first type of conductivity in a portion of the semiconductor layer, the fourth semiconductor region extending from the main surface of the semiconductor layer to said fifth buried layer, and serving as a collector electrode contact portion of the vertical pnp transistor, and to form a fifth semiconductor region of the first type of conductivity in another portion of the semiconductor layer, the fifth semiconductor region serving as a base of the npn transistor; and (7) selectively introducing impurities of the second type of conductivity into portions of said semiconductor layer and into a portion of said second semiconductor region to form a sixth semiconductor region of the second type of conductivity in a portion of said second semiconductor region, the sixth semiconductor region serving as a base electrode contact portion of the vertical pnp transistor, to form a high impurity concentration region in a portion of said second semiconductor region, said high impurity concentration region having an impurity concentration which is higher than that of said second semiconductor region, and to form a seventh semiconductor region in a portion of said fifth semiconductor region, said seventh semiconductor region serving as an emitter of the npn transistor.

17. A process for producing semiconductor devices according to claim 16, further comprising:
    (8) forming grooves in said semiconductor layer that corresponds to said fourth buried layer.

18. A process for producing semiconductor devices according to claim 16, further comprising:
    (9) forming an electrically insulating film in said semiconductor layer that corresponds to said fourth buried layer, said electrically insulating film reaching said fourth buried layer.

19. A process for producing semiconductor devices according to claim 16, further comprising:
    (10) forming a groove in said semiconductor layer to extend above said fourth buried layer and above the high impurity concentration region formed in a portion of said second semiconductor region.

20. A process for producing semiconductor devices according to claim 16, wherein the semiconductor substrate consists of silicon.

21. A process for producing semiconductor devices according to claim 16, wherein said first type of conductivity is p-type conductivity, and said second type of conductivity is n-type conductivity.

22. A process for producing semiconductor devices according to claim 16, wherein the third layer and the fourth layer are formed simultaneously.

23. A process for producing semiconductor devices according to claim 16, wherein the first semiconductor region and second semiconductor region are formed simultaneously.

24. A process for producing semiconductor devices according to claim 16, wherein said third and fourth semiconductor regions are formed simultaneously with the forming of the fifth semiconductor region.

25. A process for producing semiconductor devices according to claim 16, wherein said sixth semiconductor region and said seventh semiconductor region are formed simultaneously.

26. A process for producing semiconductor devices according to claim 16, wherein the impurities, in step (3), are simultaneously introduced into said portion of said third layer and into said fourth layer.

27. A process for producing semiconductor devices according to claim 16, wherein, during the step (4), the fourth layer and fifth layer extend into the semiconductor layer of the second type of conductivity deposited on the one main surface of said semiconductor substrate.

28. A process for producing semiconductor devices according to claim 17, wherein said grooves are formed above said fourth buried layer, to extend from said main surface of the semiconductor layer toward said fourth buried layer.

29. A process for producing semiconductor devices according to claim 18, wherein said electrically insulating film is formed above said fourth buried layer, to extend from said main surface of the semiconductor layer toward said fourth buried layer.

30. A process for producing semiconductor devices according to claim 18, wherein the electrically insulating film consists of a silicon oxide film.

31. A process for producing semiconductor devices comprising the steps of:
    (1) selectively introducing impurities of the second type of conductivity into one main surface of a semiconductor substrate of a first type of conductivity opposite to said second type of conductivity to form first and second layers having said second type of conductivity that are spaced from each other;
    (2) selectively introducing impurities of the first type of conductivity into a portion of said first layer and into a portion of said semiconductor substrate to form a third layer of the first type of conductivity in said first layer, the third layer adapted to serve as a portion of a collector of a vertical pnp transistor, and to form a fourth layer of the first type of conductivity in a portion of the semiconductor substrate, the fourth layer working as an isolation layer or a channel stop layer;
    (3) selectively introducing impurities of the first type of conductivity into a portion of said third layer and into said fourth layer to increase the impurity concentration in said fourth layer, and to selectively form a fifth layer, in said third layer, the fifth layer having an impurity concentration which is higher than that of said third layer;
    (4) after the step (3), forming a semiconductor layer of the second type of conductivity on one main surface of said semiconductor substrate, said semiconductor layer having a main surface opposite to the surface adjacent the one main surface of the semiconductor substrate, whereby the first through fifth layers become first through fifth buried layers;
    (5) forming an electrically insulating film in said semiconductor layer that corresponds to said fourth buried layer, said electrically insulating film reaching said fourth buried layer, to thereby provide in said semiconductor substrate a first island region that forms a vertical pnp transistor and a second island region that forms an npn transistor, with said first island region and said second island region being electrically isolated from each other;
    (6) selectively introducing impurities of the second type of conductivity into portions of said first and second island regions to form a first semiconductor region of the second type of conductivity in the first island region, said first semiconductor region extending from the main surface of said first island region to said third buried layer, and to form a second semiconductor region of the second type of conductivity in said second island region, said second semiconductor region extending from the main surface of said second island region to said second buried layer;

(7) selectively introducing impurities of the first type of conductivity into portions of said first and second island regions to form a third semiconductor region of the first type of conductivity in the first island region, said third semiconductor region extending from the main surface of said first island region to said fifth buried layer and serving as an emitter of the vertical pnp transistor, and forming a fourth semiconductor region of the first type of conductivity in the second island region, said fourth semiconductor region serving as a base of the npn transistor;

(8) selectively introducing impurities of the first type of conductivity to form a fifth semiconductor region in said fourth semiconductor region, said fifth semiconductor region serving as an emitter of the npn transistor;

(9) forming electrodes that are connected to said first semiconductor region, connected to a main surface of said first island region, connected to said third semiconductor region, connected to said second semiconductor region, connected to said fourth semiconductor region, and connected to said fifth semiconductor region; and (10) providing a heat treatment, after forming the electrodes, to form an ohmic contact by said electrodes to said first semiconductor region, to said third semiconductor region, to said second semiconductor region, to said fourth semiconductor region, and to said fifth semiconductor region by said heat treatment, and to form a Schottky contact on the main surface of said first island region by the electrode.

32. A process for producing semiconductor devices according to claim 31, wherein, in the step (3), the impurities of the first type of conductivity are simultaneously selectively introduced into said portion of said third layer and into said fourth layer.

33. A process for producing semiconductor devices according to claim 31, wherein, during the step (4), the fourth layer and the fifth layer extend into said semiconductor layer of the second type of conductivity formed on the one main surface of said semiconductor substrate.

34. A process for producing a semiconductor integrated circuit device having a vertical pnp transistor, comprising the steps of:

(1) selectively introducing impurities of an n-type conductivity into a main surface of a semiconductor substrate to form a first n-type region;

(2) selectively introducing impurities of a p-type conductivity into said first n-type region to form a first p-type region for a collector;

(3) selectively introducing impurities of a p-type conductivity into a part of said first p-type region for a collector so as to form a p-type region of higher impurity concentration in said part of said first p-type region;

(4) epitaxially growing a semiconductor layer of said n-type conductivity on said main surface of said semiconductor substrate, said semiconductor layer having a main surface opposite the surface adjacent the substrate;

(5) selectively introducing impurities of said n-type conductivity into said semiconductor layer and heating said semiconductor substrate so as to form a second n-type region for a base region that extends to a portion of said first p-type region from the main surface of said semiconductor layer, said portion of the first p-type region to which the second n-type region extends being a portion other than the part in which the p-type region of higher impurity concentration is formed; and (6) selectively introducing impurities of a p-type conductivity into a portion of said second n-type region and into said semiconductor layer that corresponds to said part of said first p-type region to form a second p-type region for an emitter region in said second n-type region and to form a third p-type region for a collector electrode contact portion that extends to said part of said first p-type region from the main surface of said semiconductor layer.

35. A process for producing a semiconductor integrated circuit device having a vertical pnp transistor according to claim 34, wherein the step of introducing the impurities for forming of said second n-type region is carried out by an ion implantation method.

36. A process for producing a semiconductor integrated circuit device having a vertical pnp transistor according to claim 34, wherein the impurities of a p-type conductivity selectively introduced into a portion of said second n-type region and into the semiconductor layer that corresponds to the other portion of said first p-type region are simultaneously introduced.

* * * * *